US010862268B2

(12) United States Patent
Kawahara (10) Patent No.: US 10,862,268 B2
(45) Date of Patent: Dec. 8, 2020

(54) SEMICONDUCTOR DEVICE AND METHOD FOR MANUFACTURING SEMICONDUCTOR DEVICE (71) Applicant: Mitsubishi Electric Corporation, Tokyo (JP)

(72) Inventor: Hiroyuki Kawahara, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 16/486,940

(22) PCT Filed: Apr. 4, 2017

(86) PCT No.: PCT/JP2017/014080
§ 371 (c)(1),
(2) Date: Aug. 19, 2019

(87) PCT Pub. No.: WO2018/185829
PCT Pub. Date: Oct. 11, 2018

(65) Prior Publication Data
US 2020/0021076 A1 Jan. 16, 2020

(51) Int. Cl.
*H01S 5/00* (2006.01)
*H01S 5/10* (2006.01)
(Continued)

(52) U.S. Cl.
CPC ............ *H01S 5/1053* (2013.01); *H01S 5/026* (2013.01); *H01S 5/0265* (2013.01); *H01S 5/10* (2013.01);
(Continued)

(58) Field of Classification Search
CPC .......... H01S 5/026; H01S 5/10; H01S 5/0265; H01S 5/1003; H01S 5/1007;
(Continued)

(56) References Cited

U.S. PATENT DOCUMENTS 5,345,459 A * 9/1994 Richardson ............... H01S 5/22
372/34
5,786,234 A * 7/1998 Nagai ................... H01S 5/2231
438/47
(Continued)

FOREIGN PATENT DOCUMENTS

JP    H10-505954 A    6/1998
JP    2008-066703 A   3/2008
(Continued)

OTHER PUBLICATIONS

International Search Report; Written Opinion; and Notification of Transmittal of the International Search Report and the Written Opinion of the International Searching Authority, or the Declaration issued in PCT/JP2017/014080; dated Jun. 27, 2017.

*Primary Examiner* — Kinam Park
(74) *Attorney, Agent, or Firm* — Studebaker & Brackett PC (57) ABSTRACT A semiconductor device includes a substrate, a semiconductor laser part formed on the substrate and having an active layer with an uniform composition and a first ridge structure, and an adjacent part formed on the substrate, having a core layer with an uniform composition and a second ridge structure, and being an optical modulator or an optical waveguide which is in contact with the semiconductor laser part, wherein the first ridge structure is largest in width at a first contact part which is in contact with the second ridge structure, and the second ridge structure is largest in width at a second contact part which is in contact with the first ridge structure.

8 Claims, 11 Drawing Sheets (51) Int. Cl.
*H01S 5/026* (2006.01)
*H01S 5/22* (2006.01)

(52) U.S. Cl.
CPC ............ *H01S 5/1003* (2013.01); *H01S 5/106* (2013.01); *H01S 5/1007* (2013.01); *H01S 5/1028* (2013.01); *H01S 5/1057* (2013.01); *H01S 5/1064* (2013.01); *H01S 5/22* (2013.01)

(58) Field of Classification Search
CPC .... H01S 5/1028; H01S 5/1053; H01S 5/1057; H01S 5/106; H01S 5/1064; H01S 5/22
See application file for complete search history.

(56) References Cited

U.S. PATENT DOCUMENTS

| | | | |
|---|---|---|---|
| 5,917,972 | A | 6/1999 | Davies |
| 6,455,338 | B1 * | 9/2002 | Takagi .................. H01S 5/0265 438/24 |
| 2002/0018503 | A1 * | 2/2002 | Nakamura ............ H01S 5/0265 372/50.1 |
| 2007/0258681 | A1 * | 11/2007 | Takabayashi ........... G02F 1/025 385/50 |
| 2008/0037605 | A1 | 2/2008 | Yamatoya et al. |
| 2010/0247031 | A1 | 9/2010 | Hayakawa et al. |

FOREIGN PATENT DOCUMENTS

| | | |
|---|---|---|
| JP | 2010-226062 A | 10/2010 |
| WO | 2006/077641 A1 | 7/2006 |

* cited by examiner

SEMICONDUCTOR DEVICE AND METHOD FOR MANUFACTURING SEMICONDUCTOR DEVICE

FIELD

This invention relates to a semiconductor device having a semiconductor laser part and an optical modulator or an optical waveguide on an identical substrate, and a method for manufacturing the semiconductor device.

BACKGROUND

A request for a large capacity of an optical communication network increases use of semiconductor devices in which a semiconductor laser part and an optical modulator or an optical waveguide are integrated on an identical substrate. An optical element in which a plurality of functions are integrated needs different crystal structures depending on the functions. In order to form such an optical element, there is often employed a method of repeating partial etching using an insulating film mask and regrowth.

Patent Literature 1 discloses a technology of reducing light reflection occurring at the boundary between waveguides in a semiconductor optical integrated element having, on an identical substrate, a ridge waveguide and a high mesa waveguide. In Patent Literature 1, the height of the surfaces extending on both outer sides of a mesa stripe is set to be higher in a semiconductor laser part than in an optical modulator part.

PRIOR ART

Patent Literature

Patent Literature 1: JP 2008-066703 A

SUMMARY

Technical Problem

A semiconductor laser part and an optical modulator or an optical waveguide are occasionally formed on a single substrate. Such an optical modulator or an optical waveguide is referred to as "adjacent part" for convenience of description. When the semiconductor laser part and the adjacent part are of ridge types, their structures of the ridge types tend to suffer the influence of stress from an insulating film or a metal. Therefore, such stress problematically concentrates at the joint part at which the semiconductor laser part and the adjacent part are joined with a butt joint, which has been causing initial characteristics or long-term reliability of the semiconductor device to deteriorate.

For example, since the semiconductor laser part and an EA modulator part have different optimum waveguide widths, it is needed for the ridge width to be changed in the vicinity and at the joint part of both. Moreover, the semiconductor laser part and the EA modulator part have different etching depths, so-called ridge depths, in ridge formation, and this causes a step at the joint part of both. In the case where the waveguide width changes at the joint part or in the case of a step at the joint part as above, stress tends to concentrate at the joint part in particular.

The present invention is devised in order to solve the aforementioned problems, and an object thereof is to provide a semiconductor device capable of suppressing stress concentration at a joint part of a semiconductor laser part and an optical modulator or an optical waveguide, and a method for manufacturing the semiconductor device.

Means for Solving the Problems

According to the present invention, a semiconductor device includes a substrate, a semiconductor laser part formed on the substrate and having an active layer with an uniform composition and a first ridge structure, and an adjacent part formed on the substrate, having a core layer with an uniform composition and a second ridge structure, and being an optical modulator or an optical waveguide which is in contact with the semiconductor laser part, wherein the first ridge structure is largest in width at a first contact part which is in contact with the second ridge structure, and the second ridge structure is largest in width at a second contact part which is in contact with the first ridge structure, and conductivity types of the first ridge structure and the second ridge structure are a first conductivity type at end parts of the first contact part and the second contact part, and a second conductivity type in other parts thereof.

According to the present invention, a method for manufacturing a semiconductor device includes forming a multilayer structure in which an active layer and a core layer are provided on a substrate to be adjacent to each other, forming, on the multilayer structure, a mask having a first portion right above the active layer, a second portion right above the core layer, and a boundary portion connecting the first portion and the second portion, provided right above a boundary between the active layer and the core layer, and being larger in width than the first portion and the second portion, and etching a portion of the multilayer structure, which is exposed from the mask up to the point where the active layer or the core layer is exposed, wherein the active layer and the core layer immediately after the multilayer structure forming are of a second conductivity type, the method includes after the multilayer structure forming and before the mask forming, making the active layer and the core layer at both ends of a boundary region including the boundary between the active layer and the core layer in plan view to be a first conductivity type, wherein the boundary portion of the mask covers both ends of the boundary region, and in the etching, the active layer and the core layer that are exposed from the mask are etched.

Other features of the present invention will become apparent from the following description.

Advantageous Effects of Invention

According to this invention, a wide ridge is formed at the joint part of the semiconductor laser part and the optical modulator or the optical waveguide, and thereby, stress concentration at the joint part can be suppressed.

DESCRIPTION OF EMBODIMENTS

Semiconductor devices and methods for manufacturing a semiconductor device according to embodiments are described with reference to the drawings. The same or corresponding constituent components are given the same signs, and their repeated description may be omitted.

Embodiment 1

Figure 1:
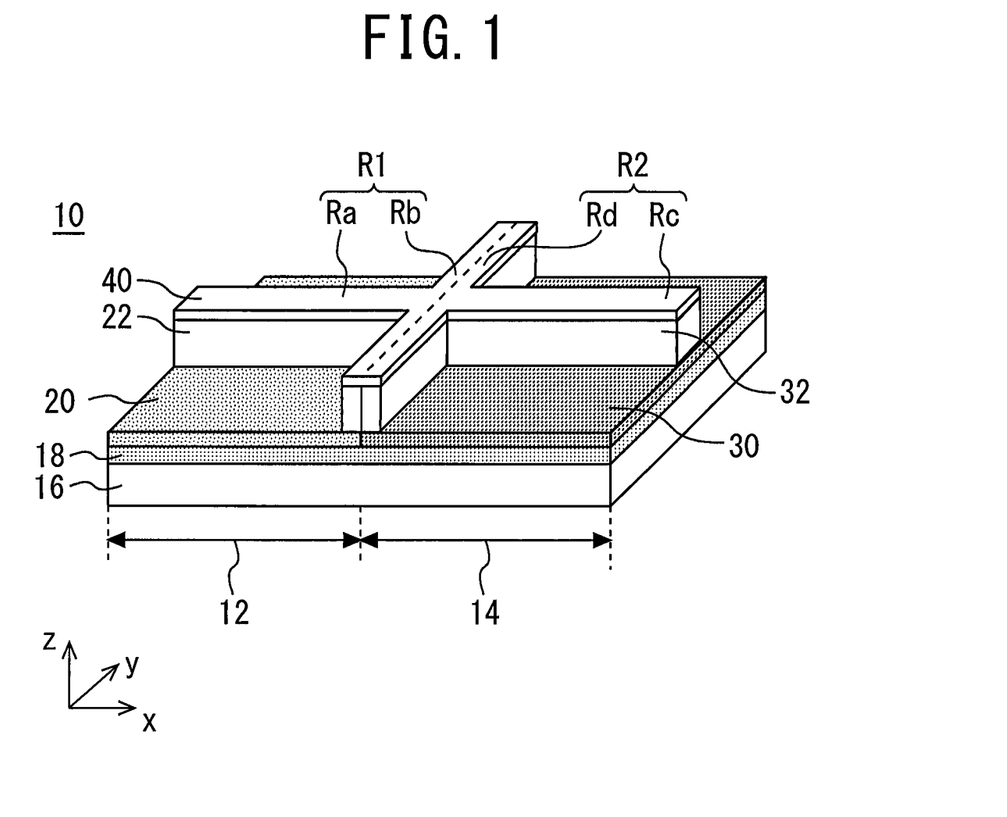
FIG. 1 is a perspective view of a semiconductor device according to embodiment 1.

FIG. 1 is a perspective view of a semiconductor device 10 according to Embodiment 1. The semiconductor device 10 composes a ridge-type optical integrated element in which a semiconductor laser part 12 and an adjacent part 14 composed of an EA (Electro-Absorption) modulator are integrated. The adjacent part 14 can be an optical modulator other than the EA modulator or an optical waveguide.

The semiconductor device 10 includes a substrate 16 formed, for example, of n-type InP. A lower clad layer 18 formed, for example, of n-type InP is provided on the substrate 16. On the lower clad layer 18, an active layer 20 is formed in the semiconductor laser part 12, and a core layer 30 is formed in the adjacent part 14. Both the active layer 20 and the core layer 30 have InGaAsP multiquantum well (MQW) structures. The active layer 20 and the core layer 30 are connected with a butt joint. The active layer 20 may take a configuration in which the MQW structure is interposed between an upper InGaAsP separation containment hetero-layer (SCH layer) and a lower SCH layer. Likewise, the core layer 30 may have two SCH layers.

A first upper clad layer 22 formed, for example, of p-type InP is provided on the active layer 20. A second upper clad layer 32 formed, for example, of p-type InP is provided on the core layer 30. A contact layer 40 is formed, for example, of p-type InGaAs on the first upper clad layer 22 and the second upper clad layer 32.

The composition of the active layer 20 in the semiconductor laser part 12 is uniform. Namely, the active layer 20 has a predefined composition anywhere on the x-yplane, and the composition is not different depending on places on the x-yplane. A first ridge structure R1 formed on the substrate 16 is provided in the semiconductor laser part 12. The composition of the core layer 30 in the adjacent part is uniform. Namely, the core layer 30 has a predefined composition anywhere on the x-yplane, and the composition is not different depending on places on the x-yplane. A second ridge structure R2 formed on the substrate 16 is provided in the adjacent part 14. The first ridge structure R1 and the second ridge structure R2 are connected with a butt joint.

The first ridge structure R1 includes a first body part Ra and a first contact part Rb. The first contact part Rb is provided closer to the adjacent part 14 side than the first body part Ra. The width of the first contact part Rb is larger than the width of the first body part Ra. The width is a length in the y-direction. The first ridge structure R1 is largest in width at the first contact part Rb which is in contact with the second ridge structure R2.

The second ridge structure R2 includes a second body part Rc and a second contact part Rd. The second contact part Rd is provided closer to the semiconductor laser part 12 side than the second body part Rc. The width of the second contact part Rd is larger than the width of the second body part Rc. The second ridge structure R2 is largest in width at the second contact part Rd which is in contact with the first ridge structure R1. The second contact part Rd and the first contact part Rb are in contact with each other. The widths of the second contact part Rd and the first contact part Rb are equal to the width of the substrate 16. As above, the ridge structure of the semiconductor device 10 is largest in width at the boundary between the semiconductor laser part 12 and the adjacent part 14.

Figure 2:
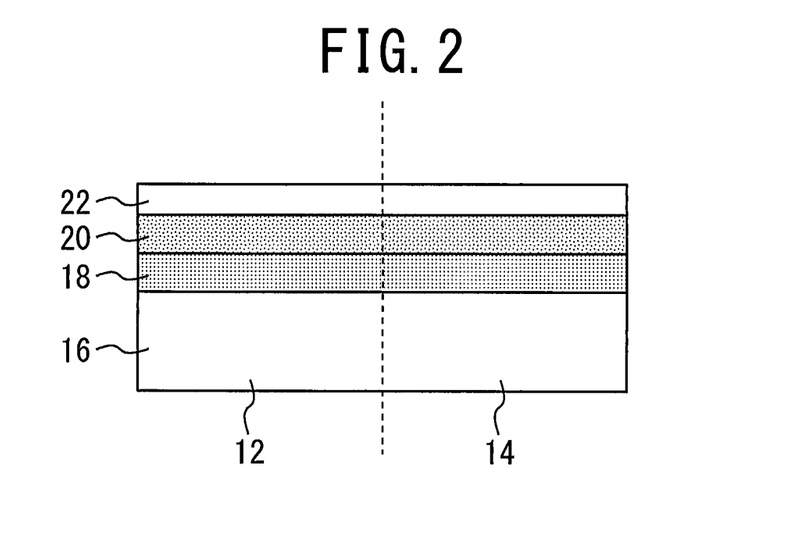
FIG. 2 is a cross-sectional view of the semiconductor device after the epitaxial growth.

A method for manufacturing the semiconductor device 10 is described. First, the lower clad layer 18 is formed of n-type InP on the substrate 16 formed of n-type InP, and thereafter, the active layer 20 and the first upper clad layer 22 are epitaxially grown in sequence. FIG. 2 is a cross-sectional view of the semiconductor device after the epitaxial growth. The lower clad layer 18 is n-type InP, the active layer 20 is in an InGaAsP multiquantum well structure, and the first upper clad layer 22 is p-type InP. The left side of the broken line is a portion to be the semiconductor laser part 12, and the right side of the broken line is a portion to be the adjacent part 14.

Figure 3:
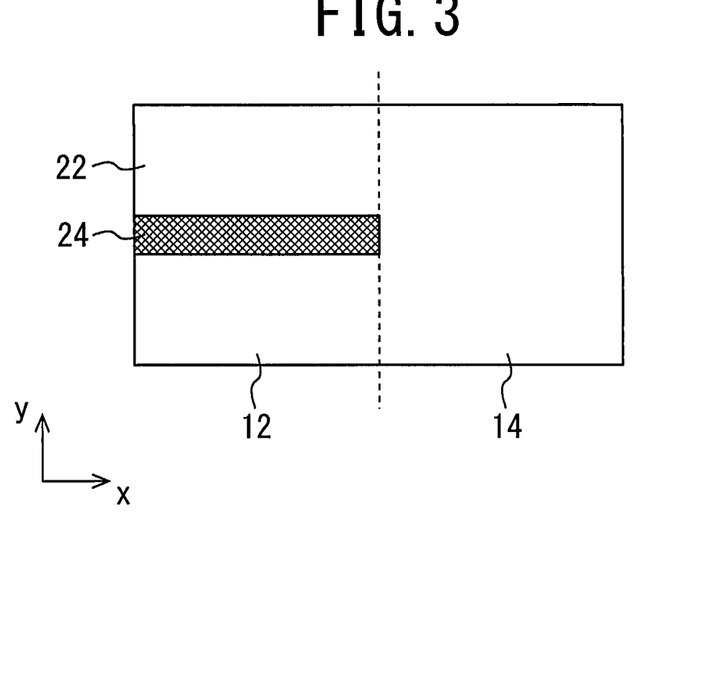
FIG. 3 is a plan view illustrating a mask.

Next, a mask is formed. FIG. 3 is a plan view illustrating a mask 24. The mask 24 is formed into a stripe shape on the first upper clad layer 22 in the semiconductor laser part 12. The material of the mask 24 is, for example, $SiO_2$. The pattern of the mask 24 is formed, for example, by performing photoetching using a resist pattern.

Figure 4:
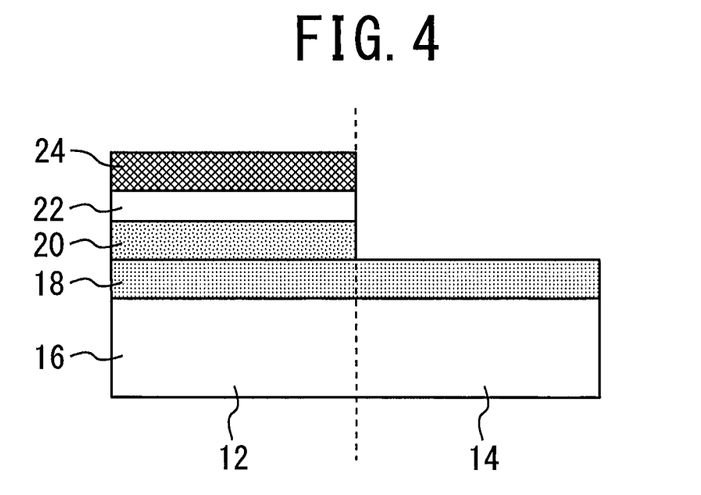
FIG. 4 is a cross-sectional view of the semiconductor device after etching.

Next, etching processing is performed. FIG. 4 is a cross-sectional view of the semiconductor device after etching. The portion that is not covered by the mask 24 is etched to the middle of the active layer 20 by dry etching such as RIE. Furthermore, the remaining portion of the active layer 20 is etched by etching using a liquid chemical with etching selectivity between InGaAsP and InP, such as tartaric acid. Thereby, the lower clad layer 18 is exposed.

Figure 5:
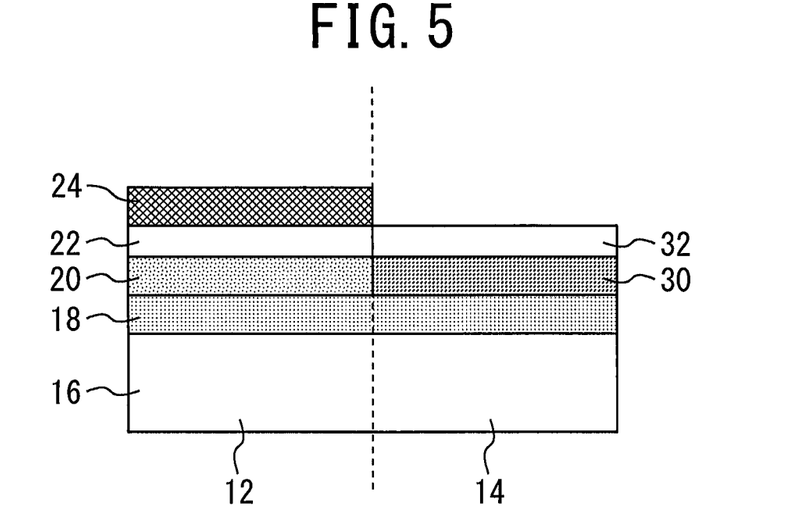
FIG. 5 is a cross-sectional view of the semiconductor device after the film forming processing.

Next, film forming processing is performed. FIG. 5 is a cross-sectional view of the semiconductor device after the film forming processing. The core layer 30 and the second upper clad layer 32 are epitaxially grown in sequence. This growth is called butt joint growth. Thereby, the core layer 30 is formed on the lower clad layer 18 in the adjacent part 14, and the second upper clad layer 32 is formed on that core layer 30.

Figure 6:
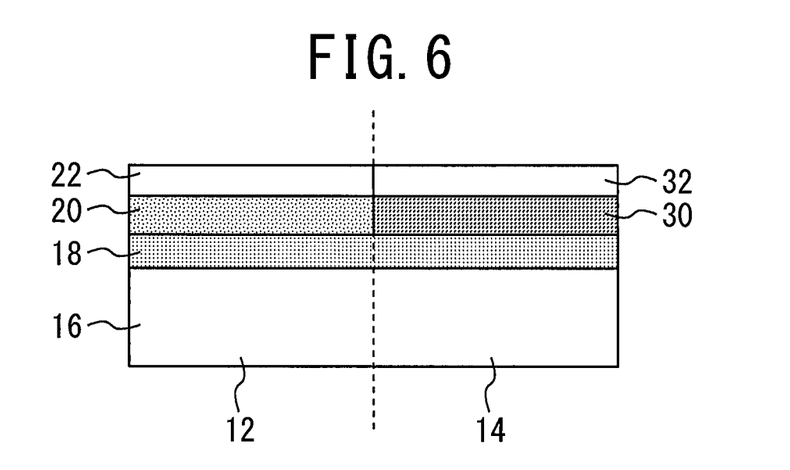
FIG. 6 is a cross-sectional view of the semiconductor device after mask removal.

Next, the mask 24 is removed. FIG. 6 is a cross-sectional view of the semiconductor device after the mask 24 was removed. The mask 24 is removed, for example, with hydrofluoric acid. After the mask 24 is removed, the first upper clad layer 22 and the second upper clad layer 32 are exposed on the surface.

Figure 7:
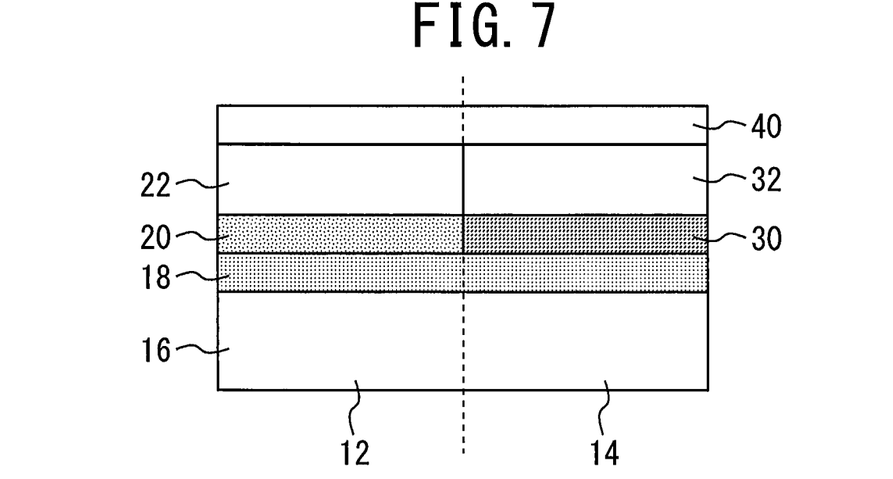
FIG. 7 is a cross-sectional view of the semiconductor device after the film forming processing.

Next, film forming processing is performed. FIG. 7 is a cross-sectional view of the semiconductor device after the film forming processing. In this process, first, a clad layer is additionally grown with p-type InP as its material, and thereby, the first upper clad layer 22 and the second upper clad layer 32 are thickened. Thereafter, the contact layer 40 is grown on the first upper clad layer 22 and the second upper clad layer 32. The material of the contact layer 40 is, for example, p-type InGaAs. The processes so far are the ones for forming a multilayer structure in which the active layer 20 and the core layer 30 are provided on the substrate 16 to be adjacent to each other. These processes are collectively referred to as film forming process. The contents of the film forming process are not limited to the aforementioned process as long as the structure illustrated in FIG. 7 is finally completed.

Figure 8:
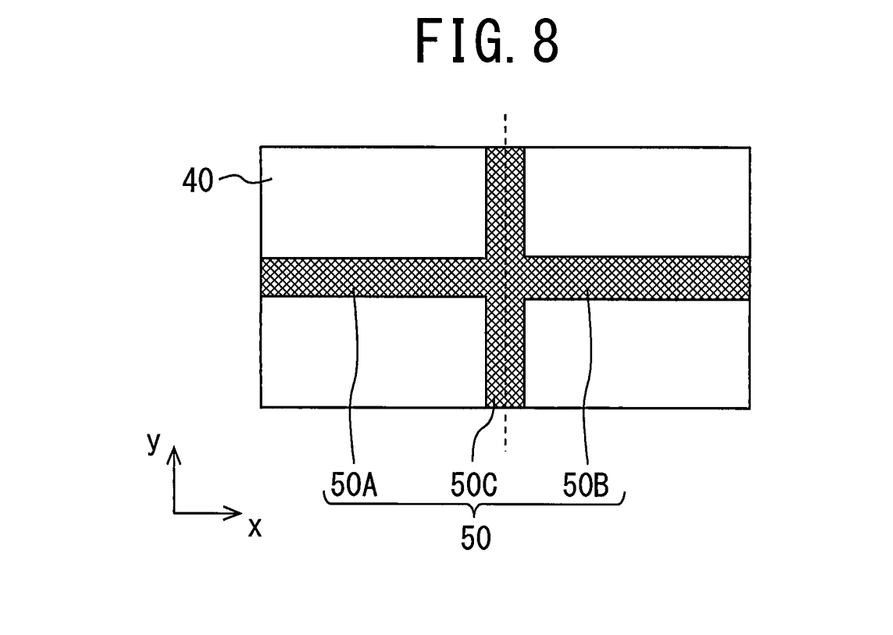
FIG. 8 is a plan view of a mask formed in the masking process.

Next, processing is put forward to a masking process. In the masking process, a mask which coincides with the planar shape of the first ridge structure R1 and the second ridge structure R2 in FIG. 1 is formed on the contact layer 40. FIG. 8 is a plan view of a mask 50 formed in the masking process. The mask 50 is a SiO$_2$ film, for example, formed by performing photoetching using a resist pattern.

Figure 9:
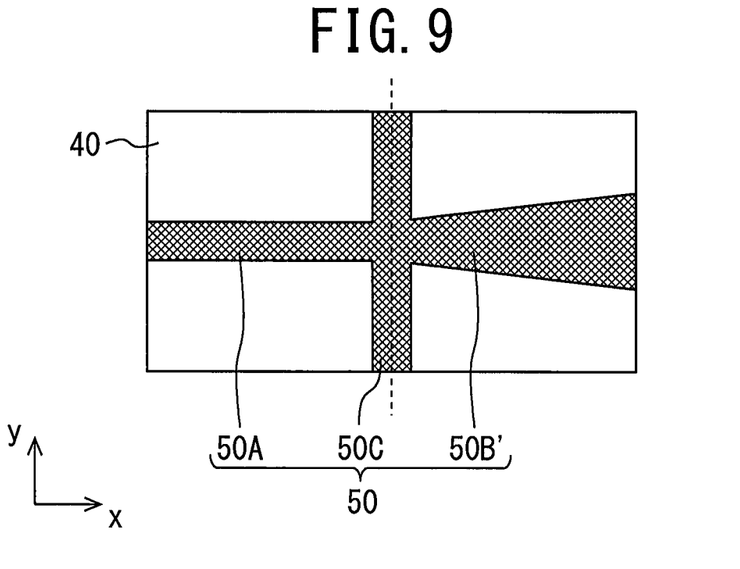
FIG. 9 is a plan view of a mask according to the modification.

The mask 50 includes, on the multilayer structure, a first portion 50A right above the active layer 20, a second portion 50B right above the core layer 30, and a boundary portion 50C connecting the first portion 50A and the second portion 50B and provided right above the boundary between the active layer 20 and the core layer 30. The width of the boundary portion 50C is larger than the widths of the first portion 50A and the second portion 50B. Furthermore, when the width of the second body part Rc of the second ridge structure R2 is made larger as going further apart from the semiconductor laser part 12, for example, a second portion 50B' illustrated in FIG. 9 can also be provided.

Next, processing is put forward to an etching process. In the etching process, portions of the multilayer structure, which are exposed from the mask 50 are etched. The contact layer 40, the first upper clad layer 22 and the second upper clad layer 32 are etched, for example, by dry etching such as RIE. Next, the mask 50 is removed using hydrofluoric acid, and thereby, a basic crystal structure of the semiconductor device 10 is completed. Notably, electrodes are formed on the first body part Ra and the second body part Rc and not formed on the first contact part Rb or the second contact part Rd.

Since in the semiconductor device 10 according to Embodiment 1, the wide first contact part Rb is provided in the first ridge structure R1, the wide second contact part Rd is provided in the second ridge structure R2, and the first contact part Rb and the second contact part Rd are brought into contact with each other, the contact area between the first ridge structure R1 and the second ridge structure R2 is large. Therefore, stress caused by insulating film formation and metal formation which are performed after forming the basic crystal structure of the semiconductor device 10 can be prevented from concentrating at the butt joint part. Namely, stress concentration at the joint part of the semiconductor laser part 12 and the adjacent part 14 which is an optical modulator or an optical waveguide can be suppressed.

With the semiconductor device and the method for manufacturing a semiconductor device according to Embodiment 1, the ridge width is made larger in the portion where the active layer 20 and the core layer 30 are in contact with each other, and thereby, stress concentration at the joint part of the semiconductor laser part 12 and an optical modulator or an optical waveguide is suppressed. They can be modified in various modes without this feature impaired. For example, the compositions of the active layer 20 and the core layer 30 may be different. Namely, butt joint growth can join waveguide cores of different types. Moreover, while the widths of the first contact part Rb and the second contact part Rd are preferably equal to each other, these widths are not necessarily required to coincide with the width of the substrate 16. A layer not mentioned above may be added to the semiconductor laser part 12 and the adjacent part 14. For example, a diffraction grating layer may be provided in the semiconductor laser part 12.

Figure 10:
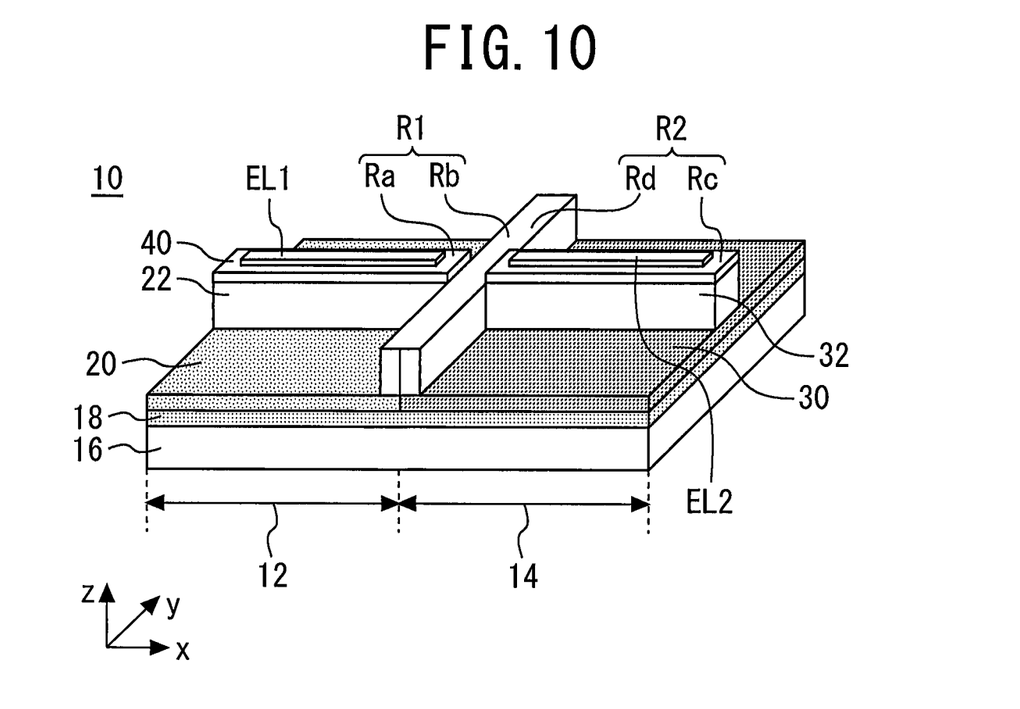
FIG. 10 is a perspective view of a semiconductor device in which the contact layer on the first contact part and the second contact part is removed.

In order to realize the optimum waveguide width, the widths of the first body part Ra and the second body part Rc may be different. Such a ridge has, for example, the same planar shape as that of the mask 50 in FIG. 9. A portion including the boundary between the semiconductor laser part 12 and the adjacent part 14 may be called a passive waveguide. With no provision of the contact layer 40 on this passive waveguide, isolation between the semiconductor laser part 12 and the adjacent part 14 can be enhanced. FIG. 10 is a perspective view of a semiconductor device in which the contact layer 40 on the first contact part Rb and the second contact part Rd is removed. By removing the contact layer 40 on the first contact part Rb and the second contact part Rd, isolation between the semiconductor laser part 12 and the adjacent part 14 can be enhanced. FIG. 10 also illustrates an electrode EL1 formed on the first body part Ra and an electrode EL2 formed on the second body part Rc.

Figure 11:
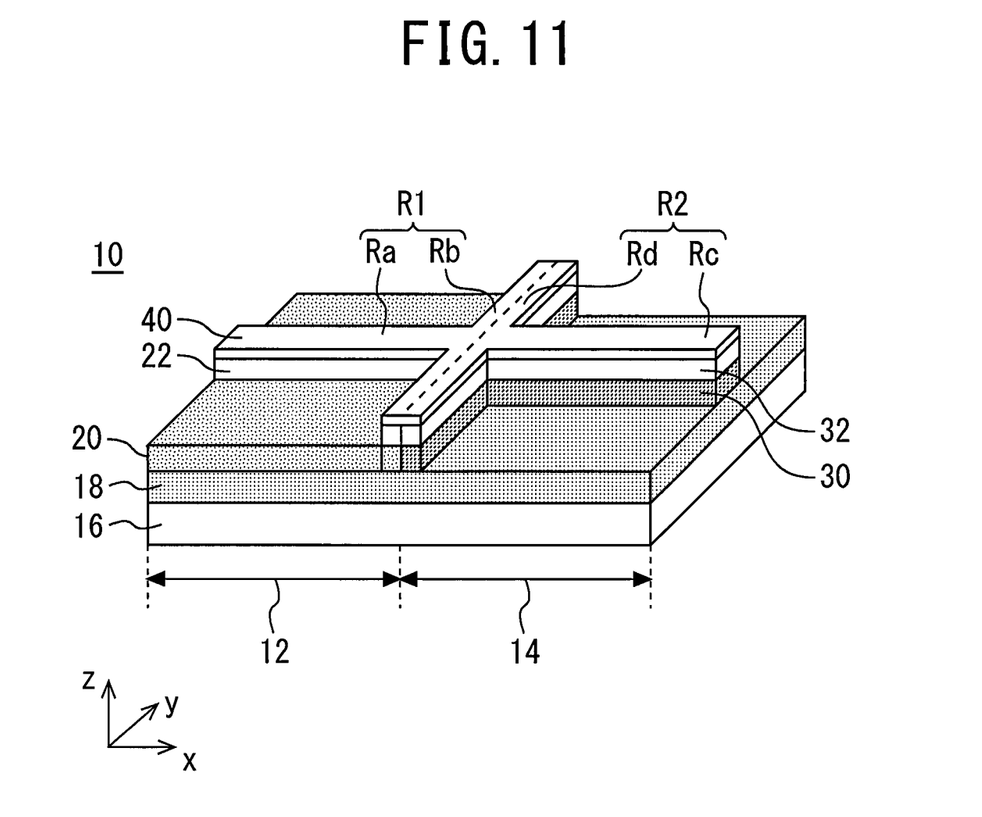
FIG. 11 is a perspective view of the first ridge structure and the second ridge structure having different height.

The ridge height of the first ridge structure R1 and the ridge height of the second ridge structure R2 may be different. FIG. 11 is a perspective view of a semiconductor device in which the ridge height of the first ridge structure R1 and the ridge height of the second ridge structure R2 are different. While the active layer 20 is formed in the whole semiconductor laser part 12, the core layer 30 is formed only in a part of the adjacent part 14. Therefore, the first ridge structure R1 is smaller in z-directional length than the second ridge structure R2. When the heights of the first ridge structure R1 and the second ridge structure R2 are different, stress especially tends to concentrate at the connection part of both. However, providing the first contact part Rb and the second contact part Rd can prevent a step from occurring at the boundary between the semiconductor laser part 12 and the adjacent part 14. As above, in the case where the ridge widths of the semiconductor laser part 12 and the adjacent part 14 change at the connection part of both or in the case of a step at the connection part of both, providing the first contact part Rb and the second contact part Rd is especially effective.

The modifications described in Embodiment 1 can also be applied to semiconductor devices and methods for manufacturing semiconductor devices according to the following embodiments. Since there are many common points between the semiconductor devices and the methods for manufacturing semiconductor devices according to the following embodiments and those of Embodiment 1, differences from Embodiment 1 are mainly described.

Embodiment 2

Figure 12:
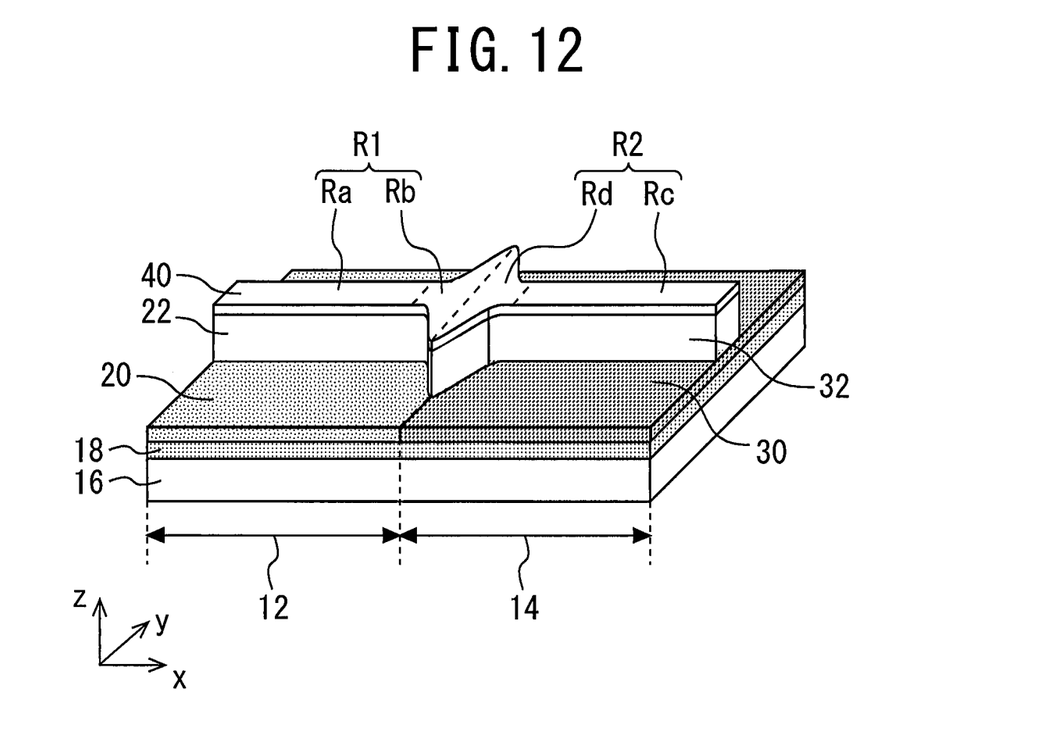
FIG. 12 is a perspective view of a semiconductor device according to embodiment 2.

FIG. 12 is a perspective view of a semiconductor device according to Embodiment 2. The first ridge structure R1 has the first contact part Rb, and the first body part Ra which is in contact with the first contact part Rb. The second ridge structure R2 has the second contact part Rd, and the second body part Rc which is in contact with the second contact part Rd. The first contact part Rb is largest in width on the second ridge structure R2 side. Namely, the width of the first contact part Rb is smallest on the first body part Ra side, becoming larger as coming closer to the second ridge structure R2, and becomes largest on the second ridge structure R2 side.

The second contact part Rd is largest in width on the first ridge structure R1 side. Namely, the width of the second contact part Rd is smallest on the second body part Rc side, becoming larger as coming closer to the first ridge structure R1, and becomes largest on the first ridge structure R1 side.

Figure 13:
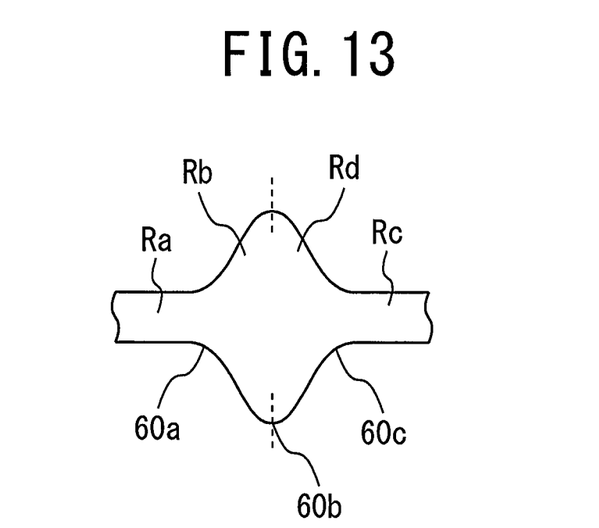
FIG. 13 is an expanded view of the first contact part and the second contact part.

FIG. 13 is an expanded view of the first contact part and the second contact part. In plan view, a connection part 60a of the first contact part Rb and the first body part Ra, a connection part 60b of the first contact part Rb and the second contact part Rd, and a connection part 60c of the second contact part Rd and the second body part Rc are smoothly formed so as not to have corners. In other words, the connection part 60a, the connection part 60b and the connection part 60c which are bent portions are rounded, and there are no corners near the first contact part Rb and the second contact part Rd.

Figure 14:
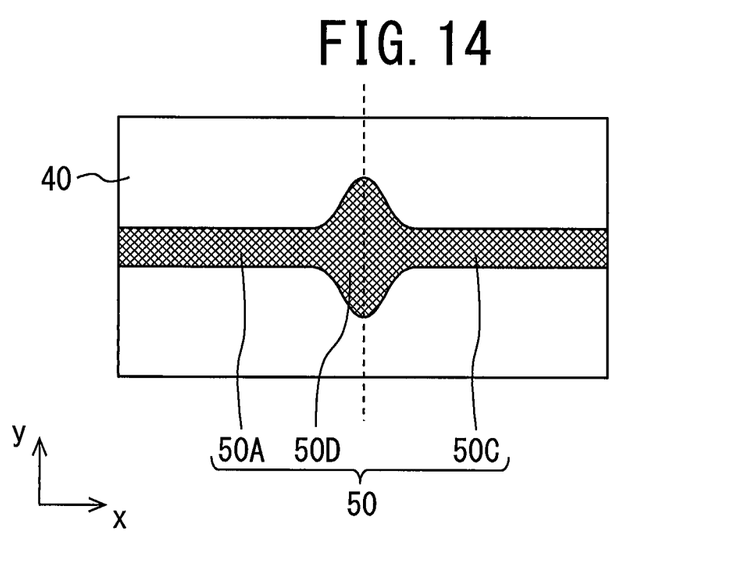
FIG. 14 is a plan view of the mask to be formed in the masking process.

FIG. 14 is a plan view of the mask 50 to be formed in the masking process. The planar shape of the mask 50 coincides with the ridge shape in FIG. 12. The width of a boundary portion 50D is smaller than the width of the substrate. Bent portions of the mask 50 are rounded. By performing the etching process using this mask 50, the semiconductor device in FIG. 12 is completed.

With the semiconductor device according to Embodiment 2, in addition to the effect of suppressing stress concentration described in Embodiment 1, since there are no corners near the first contact part Rb and the second contact part Rd, stress concentration at bent portions of the ridge can be suppressed. In Embodiment 2, it is important for bent portions in plan view to be rounded in the first ridge structure R1 and the second ridge structure R2. It can be modified in various modes without this feature impaired. For example, portions at which the ridge is bent may be provided at portions other than the portions illustrated in FIG. 13.

Embodiment 3

Figure 15:
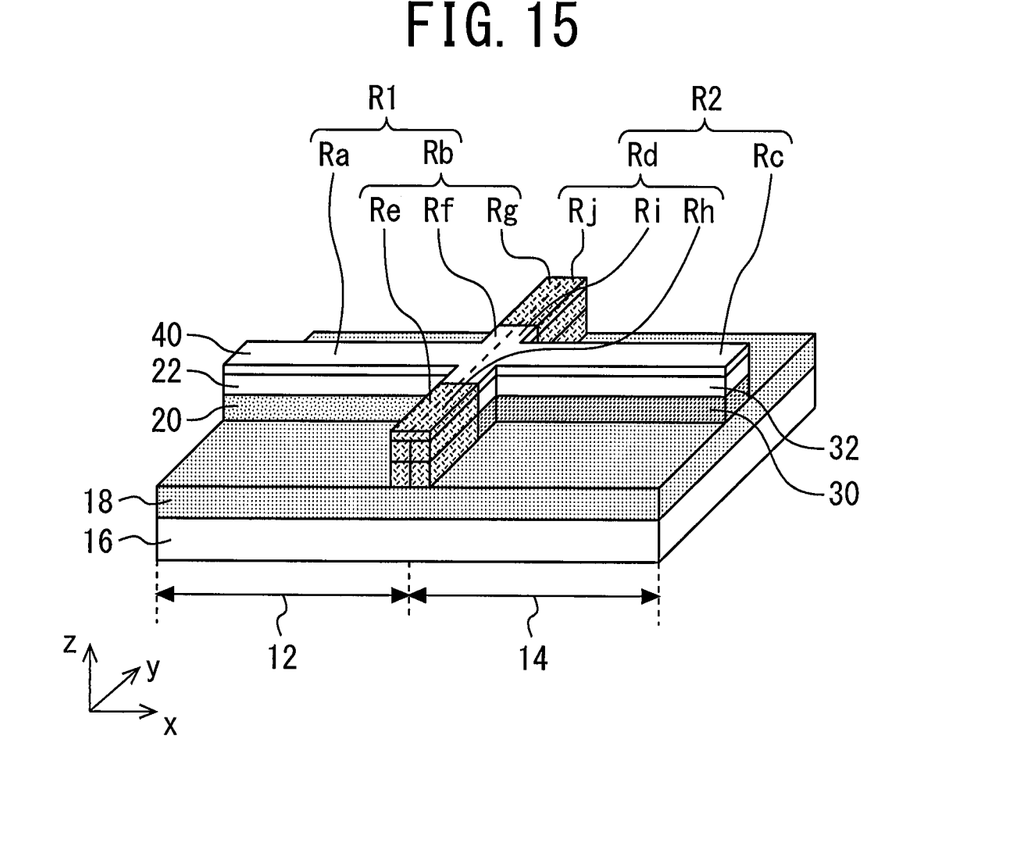
FIG. 15 is a perspective view of a semiconductor device according to embodiment 3.

FIG. 15 is a perspective view of a semiconductor device according to Embodiment 3. The first contact part Rb includes a center part Rf, and end parts Re and Rg provided on both sides of the center part Rf. The active layer 20 and the first upper clad layer 22 in the center part Rf are of p-type. On the contrary, the active layer 20 and the first upper clad layer 22 in the end parts Re and Rg are of n-type.

The second contact part Rd includes a center part Ri, and end parts Rh and Rj provided on both sides of the center part Ri. The core layer 30 and the second upper clad layer 32 in the center part Ri are of p-type. On the contrary, the core layer 30 and the second upper clad layer 32 in the end parts Rh and Rj are of n-type. Accordingly, the conductivity type of the first ridge structure R1 and the second ridge structure R2 is a first conductivity type in the end parts of the first contact part Rb and the second contact part Rd, and a second conductivity type in the other portions. The first conductivity type is the n-type, and the second conductivity type is the p-type.

The densities of n-type semiconductor in the end parts Re, Rg, Rj and Rh are preferably not less than 1E+18 cm$^{-3}$. The n-type semiconductors in the end parts Re, Rg, Rj and Rh are, for example, Si, S, Se or Te.

A method for manufacturing a semiconductor device according to Embodiment 3 is described. First, the film forming process in Embodiment 1 is performed. All of the active layers and the core layers immediately after the film forming process are of p-type. After the film forming process, a conductivity type changing process is performed before the masking process. In the conductivity type changing process, the active layer and the core layer at both ends of a boundary region including the boundary between the active layer and the core layer in plan view are to be made for n-type.

Figure 16:
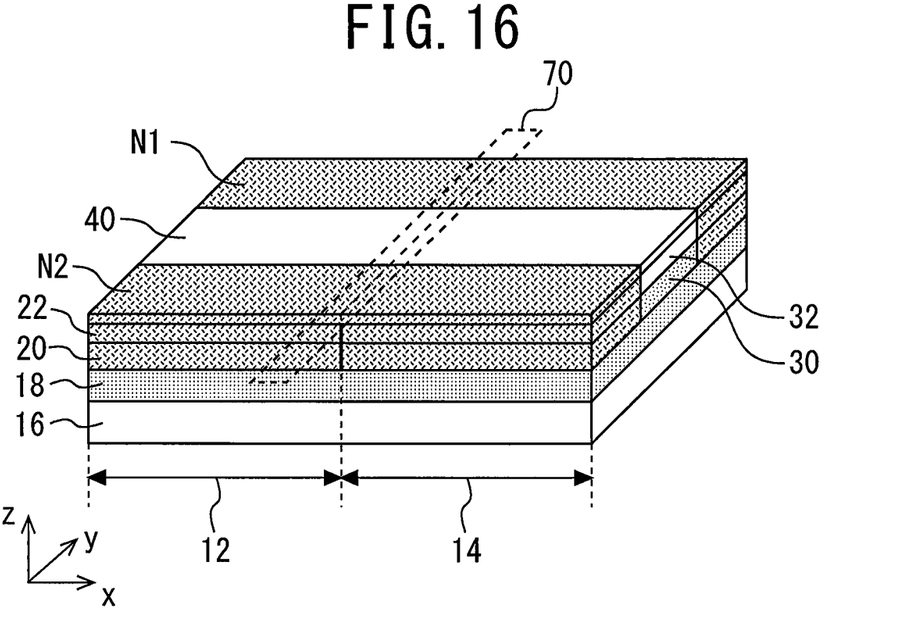
FIG. 16 is a perspective view of the semiconductor device after the conductivity type changing process.

FIG. 16 is a perspective view of the semiconductor device after the conductivity type changing process. The region surrounded by broken lines is a boundary region 70. Into portions at both ends of the boundary region 70, an n-type impurity is implanted, or an n-type impurity is diffused. For example, Si, S, Se or Te is ion-implanted or diffused thereinto. Thereby, n-type regions N1 and N2 can be formed in the end parts of the boundary region 70. While the n-type regions N1 and N2 in FIG. 16 are formed entirely in the longitudinal direction of the resonator, at least end parts of the boundary region 70 are to be made for n-type.

The masking processing is performed after the conductivity type changing process. In the masking process, the mask 50, for example, in the same shape as that in FIG. 8 is formed. Both ends of the boundary region 70 are covered by the boundary portion 50C of the mask 50. Then, by performing the etching process, the semiconductor device illustrated in FIG. 15 can be completed.

With the semiconductor device according to Embodiment 3, since the end parts Re, Rg, Rj and Rh of the first contact part Rb and the second contact part Rd are of high density n-type, a carrier plasma effect can reduce a refractive index to suppress an optical distribution in the butt joint part from widening. In other words, light can be suppressed from spreading in the y-direction in the butt joint part. Although in the first contact part Rb and the second contact part Rd, both p-regions and n-regions are to exist, it does not have an adverse effect since the first contact part Rb and the second contact part Rd are so-called passive regions where no electrodes are formed due to electric isolation between the semiconductor laser part 12 and the adjacent part 14 such as an EA modulator.

The conductivity types of the individual portions of the semiconductor device may be inverted. While the first conductivity type is set to be the n-type and the second conductivity type is set to be the p-type, the first conductivity type may be the p-type and the second conductivity type may be the n-type.

Figure 17:
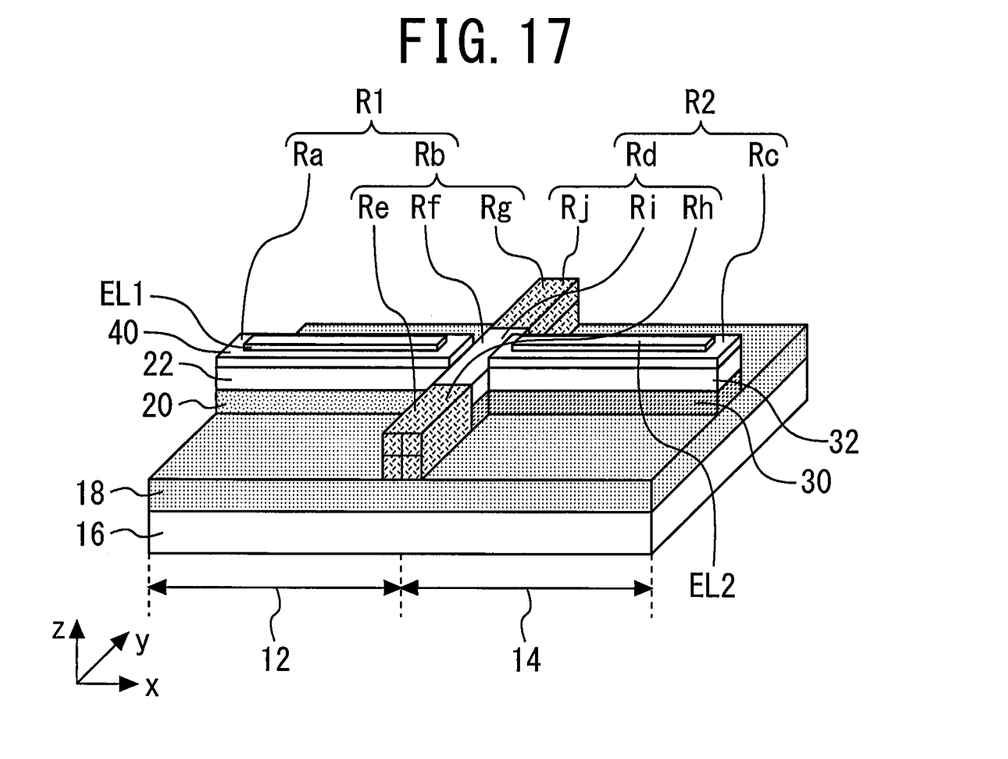
FIG. 17 is a perspective view of a semiconductor device according to a modification.

FIG. 17 is a perspective view of a semiconductor device according to a modification. This semiconductor device is different from the semiconductor device in FIG. 15 in that the passive waveguide which is a portion including the boundary between the semiconductor laser part 12 and the adjacent part 14 does not have the contact layer 40, and in that the electrodes EL1 and EL2 are illustrated. By removing the contact layer 40 on the first contact part Rb and the second contact part Rd, isolation between the semiconductor laser part 12 and the adjacent part 14 can be enhanced.

Figure 18:
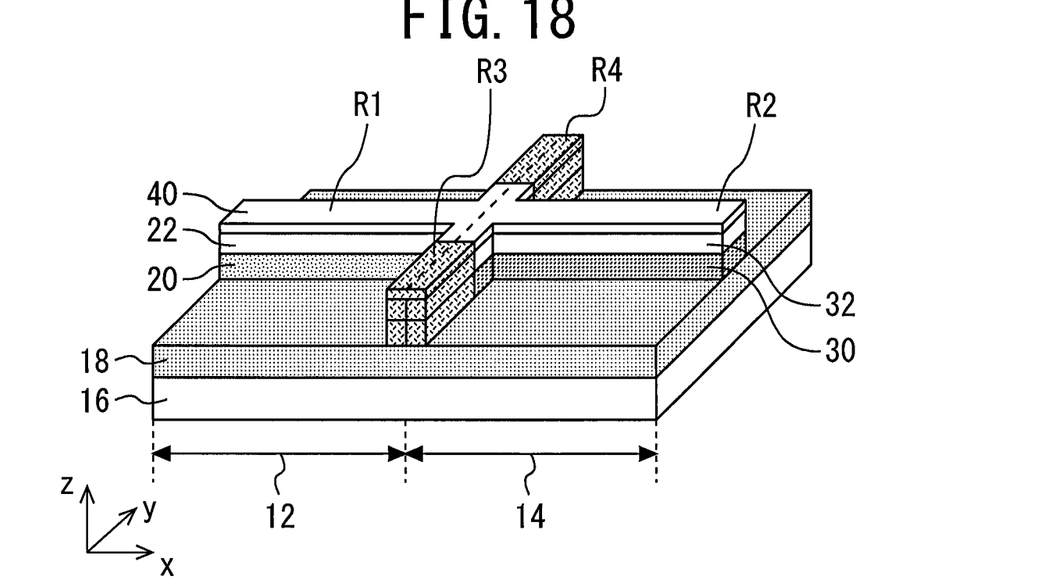
FIG. 18 is a perspective view of a semiconductor device according to another modification.

FIG. 18 is a perspective view of a semiconductor device according to another modification. While in Embodiment 3, implantation of an impurity or diffusion of an impurity is employed in the conductivity type changing process, ridges of the first conductivity type may be formed through epitaxial growth. The first ridge structure R1 and the second ridge structure R2 have the conductivity type of p-type. Reinforcement ridges R3 and R4 are formed on the lateral surfaces of the first ridge structure R1 and the second ridge structure R2. The reinforcement ridges R3 and R4 have the conductivity type of n-type. The reinforcement ridges R3 and R4 are formed in an epitaxial growth process which is a separate process from that for the first ridge structure R1 and the second ridge structure R2.

A method for manufacturing the semiconductor device illustrated in FIG. 18 is described. First, the first ridge structure R1 of the second conductivity type and the second ridge structure R2 of the second conductivity type are formed on the substrate 16. The first ridge structure R1 and the second ridge structure R2 are basically formed in the film forming process, the masking process and the etching process which are described in Embodiment 1. However, in the etching process of the present embodiment, in addition to the contact layer 40, the first upper clad layer 22 and the second upper clad layer 32, the active layer 20 and the core layer 30 that are exposed from the mask are etched. Next, the reinforcement ridges R3 and R4 are formed through epitaxial growth with dope of a first conductivity type impurity. The reinforcement ridges R3 and R4 are formed right above the boundary between the semiconductor laser part 12 and the adjacent part 14 so as to be in contact with the first ridge structure R1 and the second ridge structure R2. As a result, the reinforcement ridges R3 and R4 are formed along the joint part of the semiconductor laser part 12 and the adjacent part 14. As above, the semiconductor device in FIG. 18 is completed.

Figure 19:
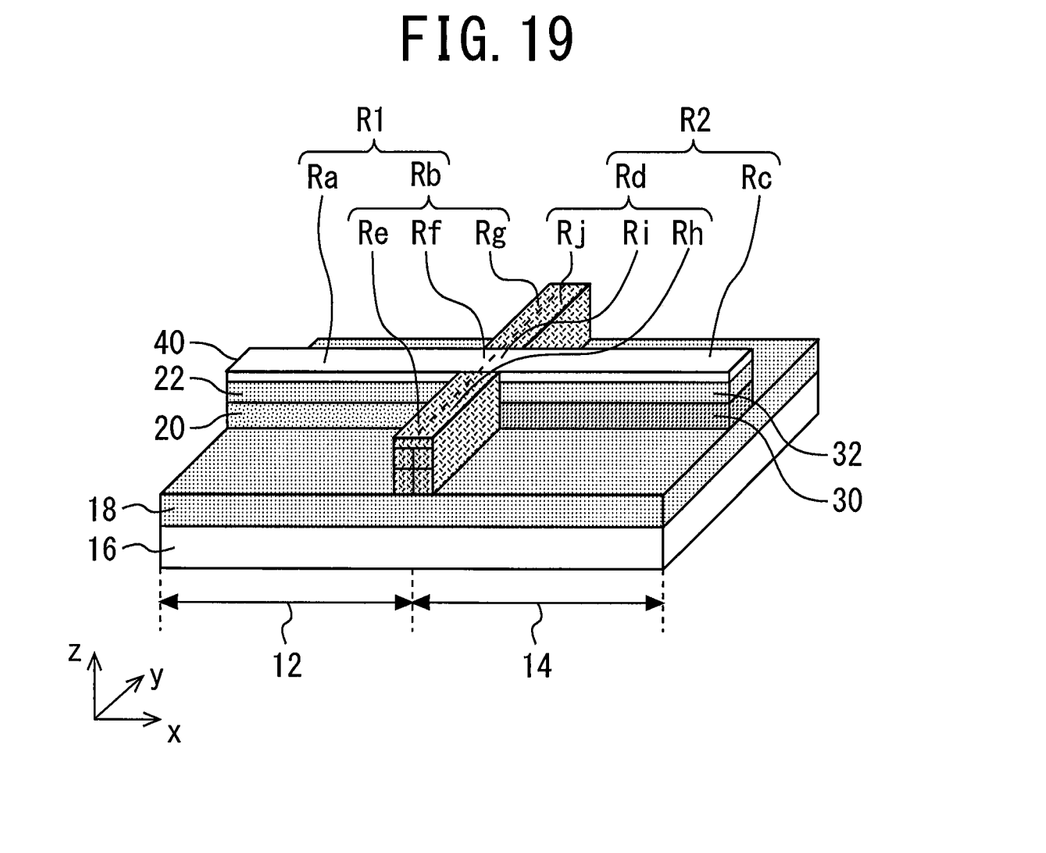
FIG. 19 is a perspective view of a semiconductor device according to still another modification.
Figure 20:
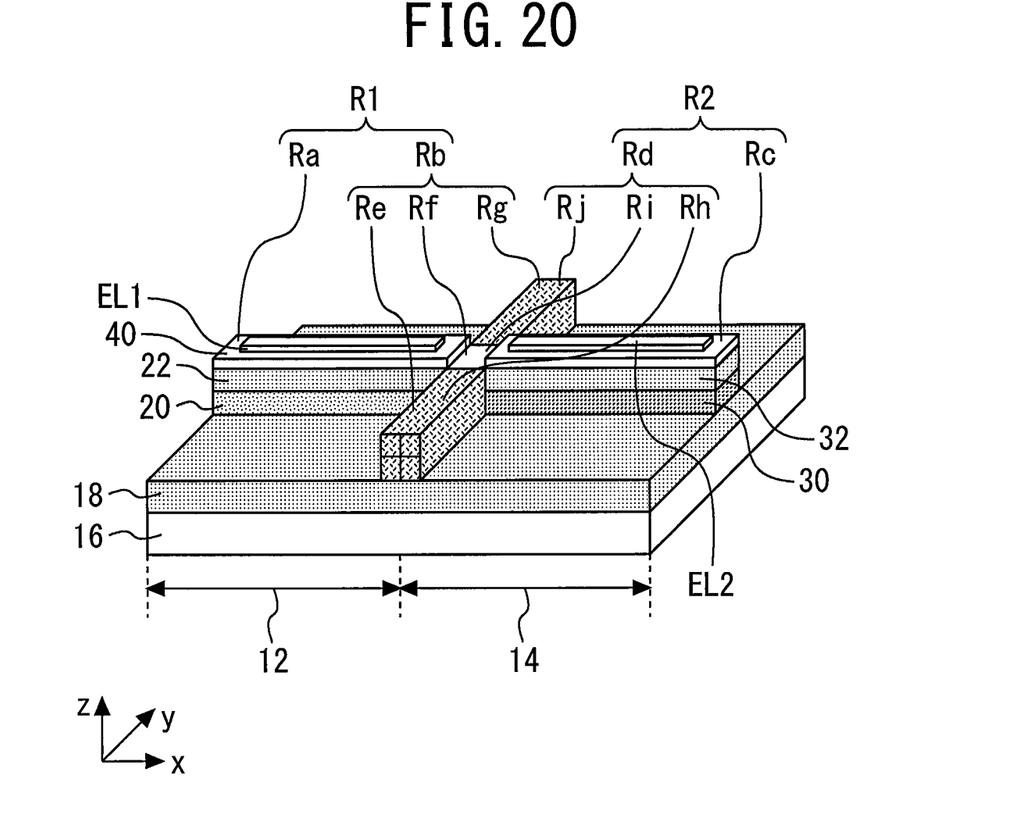
FIG. 20 is a perspective view of a semiconductor device in which the electrodes are added to the semiconductor device in FIG. 19 and the contact layer on the passive waveguide is removed.

FIG. 19 is a perspective view of a semiconductor device according to a modification different from those in FIGS. 17 and 18. In this semiconductor device, the end parts Re, Rg, Rh and Rj in FIG. 15 are extended in the y-direction. By elongating the n-type end parts Re, Rg, Rh and Rj in the y-direction, the widths of the p-type portions of the first ridge structure R1 and the second ridge structure R2 are set to be constant. FIG. 19 discloses that the widths of the p-type portions of the first ridge structure R1 and the second ridge structure R2 are constant. By changing the y-directional lengths of the end parts Re, Rg, Rh and Rj in this way, widening of an optical distribution in the butt joint part can be adjusted. FIG. 20 is a perspective view of a semiconductor device in which the electrodes EL1 and EL2 are added to the semiconductor device in FIG. 19 and the contact layer 40 on the passive waveguide is removed.

Now, the widths of the first contact part Rb and the second contact part Rd in FIGS. 15, 17, 19 and 20 coincide with the width of the substrate 16, and the reinforcement ridges R3 and R4 in FIG. 18 extend to the lateral surfaces of the substrate 16. Nevertheless, the widths of the n-type ridges in FIGS. 15, 17, 19 and 20 can be reduced, and the widths of the reinforcement ridges R3 and R4 in FIG. 18 can be reduced. Moreover, for example, as to the first ridge structure R1 and the second ridge structure R2 illustrated in FIG. 15, portions where the widths change in plan view may be rounded as described in Embodiment 2. As above, the features of the semiconductor devices and the methods for manufacturing semiconductor devices according to the aforementioned embodiments can be combined to enhance the effects. Accordingly, in all the aforementioned semiconductor devices, for example, the widths of the first body part Ra and the second body part Rc may be made different, and the ridge heights of the semiconductor laser part 12 and the adjacent part 14 may be made different.

DESCRIPTION OF SYMBOLS

10 Semiconductor device, 12 Semiconductor laser part, 14 Adjacent part, 16 Substrate, 18 Lower clad layer, R1 First ridge structure, Ra First body part, Rb First contact part, Rc Second body part, Rd Second contact part

The invention claimed is:

1. A semiconductor device comprising:
a substrate;
a semiconductor laser part formed on the substrate and having an active layer with an uniform composition and a first ridge structure; and
an adjacent part formed on the substrate, having a core layer with an uniform composition and a second ridge structure, and being an optical modulator or an optical waveguide which is in contact with the semiconductor laser part, wherein
the first ridge structure is largest in width at a first contact part which is in contact with the second ridge structure, and the second ridge structure is largest in width at a second contact part which is in contact with the first ridge structure, and
conductivity types of the first ridge structure and the second ridge structure are a first conductivity type at end parts of the first contact part and the second contact part, and a second conductivity type in other parts thereof.

2. The semiconductor device according to claim 1, wherein widths of parts, of the first ridge structure and the second ridge structure, having the second conductivity type are constant.

3. The semiconductor device according to claim 1, wherein the first conductivity type is an n-type, the second conductivity type is a p-type, and a density of n-type semiconductor in parts of the first conductivity type is not less than 1E+18 cm−3.

4. The semiconductor device according to claim 3, wherein the end parts of the first contact part and the second contact part are doped with Si, S, Se or Te.

5. A method for manufacturing a semiconductor device comprising:
forming a multilayer structure in which an active layer and a core layer are provided on a substrate to be adjacent to each other;
forming, on the multilayer structure, a mask having a first portion right above the active layer, a second portion right above the core layer, and a boundary portion connecting the first portion and the second portion, provided right above a boundary between the active layer and the core layer, and being larger in width than the first portion and the second portion; and
etching a portion of the multilayer structure, which is exposed from the mask up to the point where the active layer or the core layer is exposed,
wherein
the active layer and the core layer immediately after the multilayer structure forming are of a second conductivity type, the method comprising
after the multilayer structure forming and before the mask forming, making the active layer and the core layer at both ends of a boundary region including the boundary between the active layer and the core layer in plan view to be a first conductivity type, wherein the boundary portion of the mask covers both ends of the boundary region, and in the etching, the active layer and the core layer that are exposed from the mask are etched.

6. The method for manufacturing a semiconductor device according to claim 5, wherein in the conductivity type changing, a first conductivity-type impurity is implanted into both ends of the boundary region.

7. The method for manufacturing a semiconductor device according to claim 5, wherein in the conductivity type changing, a first conductivity-type impurity is diffused into both ends of the boundary region.

8. A method for manufacturing a semiconductor device comprising:

forming, on a substrate, a semiconductor laser part having a first ridge structure of a second conductivity type, and an adjacent part having a second ridge structure of a second conductivity type and being an optical modulator or an optical waveguide which is in contact with the semiconductor laser part; and forming a reinforcement ridge, which is in contact with the first ridge structure and the second ridge structure, right above a boundary between the semiconductor laser part and the adjacent part, through epitaxial growth with dope of a first conductivity type impurity.

* * * * *